United States Patent [19]

Jones

[11] Patent Number: 5,390,672

[45] Date of Patent: Feb. 21, 1995

[54] NMR LIVER COIL

[75] Inventor: Randall W. Jones, Elkhorn, Nebr.

[73] Assignee: Board of Regents Univ. of Nebraska, Lincoln, Nebr.

[21] Appl. No.: 134,294

[22] Filed: Oct. 8, 1993

[51] Int. Cl.⁶ .............................................. A01B 5/055
[52] U.S. Cl. .................. 128/653.5; 324/318; 324/322; 600/13; 600/15
[58] Field of Search .......................... 128/653.5, 653.2; 324/309, 318, 322; 600/13–15

[56] References Cited

U.S. PATENT DOCUMENTS

| | | | |
|---|---|---|---|
| 3,915,151 | 10/1975 | Kraus | 600/13 |
| 4,284,146 | 11/1988 | Mancuso et al. | 324/318 X |
| 4,791,372 | 12/1988 | Kirk et al. | 324/318 |
| 4,831,330 | 5/1989 | Takahashi | 128/653.5 X |
| 4,920,318 | 4/1990 | Misic et al. | 324/318 |
| 5,136,244 | 8/1992 | Jones et al. | 324/318 |
| 5,166,618 | 11/1992 | Jones et al. | 324/318 |
| 5,261,403 | 11/1993 | Saito et al. | 324/318 X |

Primary Examiner—William E. Kamm
Assistant Examiner—Brian L. Casler
Attorney, Agent, or Firm—Zarley, McKee, Thomte, Voorhees & Sease; Mark D. Frederksen

[57] ABSTRACT

A NMR liver coil includes an anterior housing supporting a plurality of NMR coils pivotally connected to a posterior housing supporting a NMR coil. The anterior housing is curved from a generally horizontal upper end to a generally vertical lower end, and pivotally connected to a generally vertically oriented flange forming the upper end of the posterior housing. The posterior housing is curved from the forward to the rearward end to conform to the curvature of a conventional NMR patient table, with the flange curving rearwardly and upwardly from the upper end of the posterior housing. The anterior housing is operably and pivotally connected to the posterior housing about a pair of pivotal axes, such that pivotal movement about a first pivotal axis will permit movement of the anterior housing from a working position with the anterior housing upper end oriented generally horizontally over the posterior housing, to an open position with the upper end of the anterior housing generally vertical. Pivotal movement about the second pivotal axis permits adjustability of the anterior housing within the working position, varying the distance between the anterior housing upper end and posterior housing to permit various patient sizes between the anterior and posterior housings.

8 Claims, 4 Drawing Sheets

NMR LIVER COIL

TECHNICAL FIELD

The present invention relates generally to magnetic resonance imaging (MRI) and more particularly to local coils for use in receiving MRI signals.

BACKGROUND OF THE INVENTION

Nuclear magnetic resonance (NMR) refers generally to one form of gyromagnetic spectroscopy which is conducted to study nuclei that have magnetic moments. Any nucleus which possesses a magnetic moment attempts to align itself with the direction of the magnetic field in which it is located. The nucleus precesses around the direction of the magnetic field at a characteristic angular frequency known as the Larmor frequency. The Larmor frequency is dependent upon the strength of the magnetic field and on the properties of the specific nuclear species.

Subjecting human tissue to a uniform magnetic field will cause the individual magnetic moments of the paramagnetic nuclei in the tissue to attempt to align with this magnetic field, but will precess about it in random order at their characteristic Larmor frequency. If the tissue is irradiated with a magnetic field (excitation field $B_1$) which is in the perpendicular plane relative to the direction of the polarizing field $B_z$, and which is near the Larmor frequency, the net aligned moment $M_z$, can be rotated into the perpendicular plane (x-y plane) to produce a net transverse magnetic moment $M_1$ which is rotated in the x-y plane at the Larmor frequency. Once the magnetic field (excitation field $B_1$) is terminated, an oscillating sine wave (referred to as an NMR signal) is induced in a receiving coil by the rotating field produced by the transverse magnetic moment $M_1$. The frequency of the signal is the Larmor frequency, and its magnitude is determined by the magnitude of $M_1$.

A weak nuclear magnetic resonance generated by the precessing nuclei may be sensed by an RF coil and recorded as an NMR signal. From this NMR signal, a slice image may be derived according to well known reconstruction techniques. The quality of the image produced by the MRI techniques is dependent, in part, on the strength of the NMR signal received from the precessing nuclei. For this reason, an independent RF receiving coil is placed in close proximity to the region of interest of the imaged object to improve the strength of this received signal. Such coils are referred to as "local coils" or "surface coils".

"Whole body" NMR scanners are sufficiently large to receive an entire human body, and to produce an image of any portion thereof. Such whole body scanners may employ an excitation coil for producing the excitation field and a separate receiver coil for receiving the NMR signal. The excitation coil produces a highly uniform excitation field throughout the entire area of interest, whereas the receiver coil is placed near the immediate area of interest to receive the NMR signal.

The smaller area of the local coils permit them to accurately focus on NMR signal from the region of interest. The smaller size of the local coil makes it important that the local coil be accurately positioned near the region of interest. For "whole volume" coils, employing two antenna loops to receive the NMR signal from a volume defined between the loops, accurate positioning of the coils is particularly important. This leads to the development of local coils which conform to the anatomy of interest, yet function to permit ease of use.

SUMMARY OF THE INVENTION

It is therefore an object of the present invention to provide an improved NMR local coil designed to conform to a patient's lower abdominal region on a variety of patient sizes.

Yet another object is to provide an NMR local coil which is operable to permit ease of patient entrance into the coil set.

Still another object of the present invention is to provide an NMR local coil with a coil form geometry which has been formed to facilitate close coupling of the imaging coil's region of sensitivity to the lower abdominal region of a patient, and more particularly to the liver.

These and other objects will be apparent to those skilled in the art.

The NMR liver coil of the present invention includes an anterior housing supporting a plurality of NMR coils pivotally connected to a posterior housing supporting a NMR coil. The anterior housing is curved from a generally horizontal upper end to a generally vertical lower end, and pivotally connected to a generally vertically oriented flange forming the upper end of the posterior housing. In one embodiment, the posterior housing is curved from the forward to the rearward end to conform to the curvature of a conventional NMR patient table, with the flange curving rearwardly and upwardly from the upper end of the curved portion of the posterior housing. The anterior housing is operably and pivotally connected to the posterior housing about a pair of pivotal axes, such that pivotal movement about a first pivotal axis will permit movement of the anterior housing from a working position with the anterior housing upper end oriented generally horizontally over the posterior housing, to an open position with the upper end of the anterior housing generally vertical. Pivotal movement about the second pivotal axis permits adjustability of the anterior housing within the working position, varying the distance between the anterior housing upper end and posterior housing to permit various patient sizes between the anterior and posterior housings. In a second embodiment, the anterior housing is pivotally connected to the posterior housing about a single axis, permitting both slight adjustment for patient size, and substantial movement for entry and exit of a patient.

DESCRIPTION OF THE PREFERRED EMBODIMENTS

Figure 1:
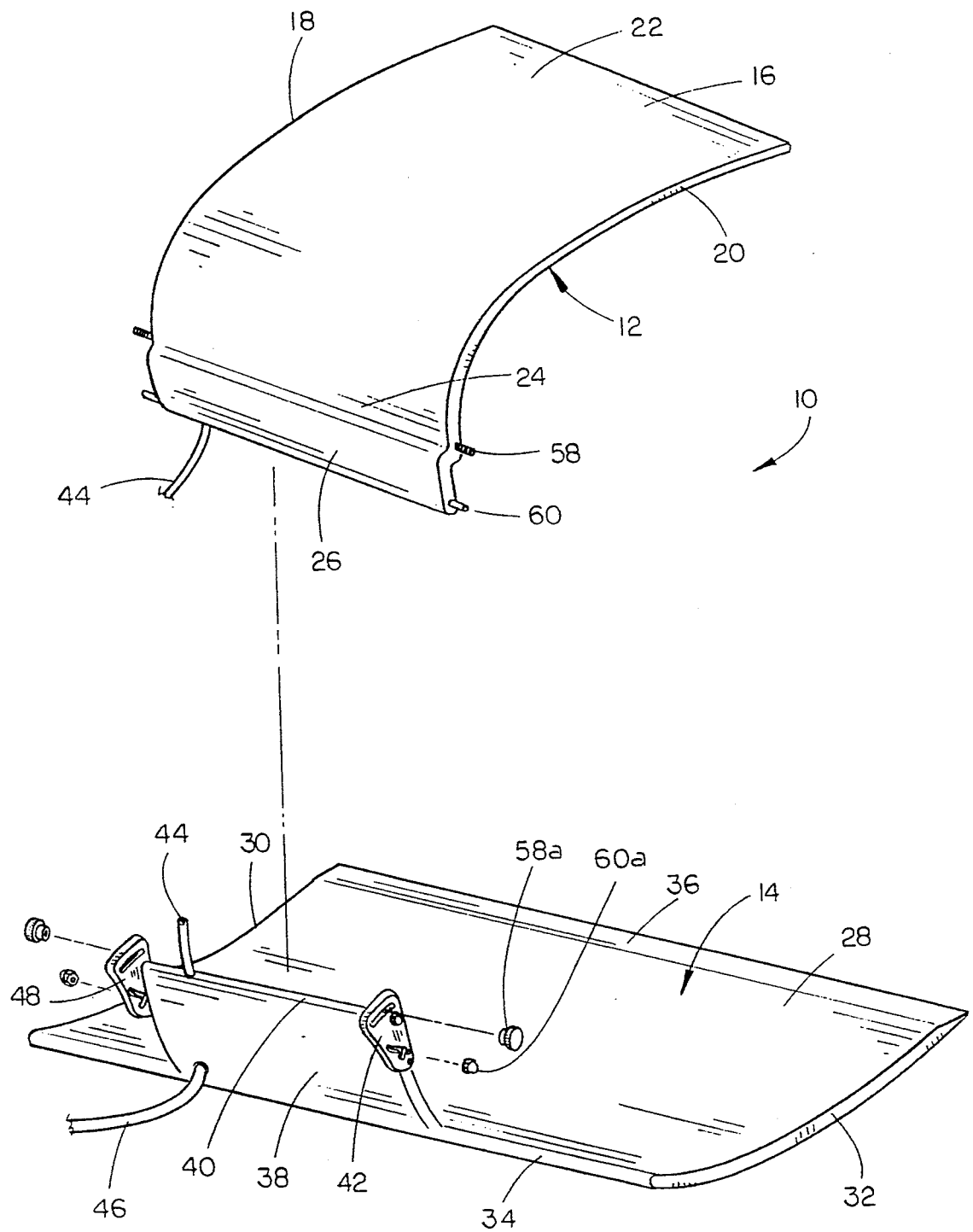
FIG. 1 is an exploded perspective view of the NMR liver coil of the present invention.

Referring now to the drawings, in which similar or corresponding parts are identified with the same reference numeral, and more particularly to FIG. 1, the NMR local liver coil of the present invention is designated generally at 10 and includes an upper anterior segment 12 operably mechanically connected to an opposed lower posterior segment 14.

Anterior segment 12 includes a plurality of electronic coils enclosed within a durable plastic housing 16. Housing 16 includes opposing forward and rearward edges 18 and 20, an upper end 22 and a lower end 24. Housing 16 is arcuate between upper end 22 and lower end 24, so as to extend from a generally horizontal position at upper end 22 to a generally vertical position at lower end 24, when anterior segment 12 is in the operable position shown in FIG. 2.

Figure 3:
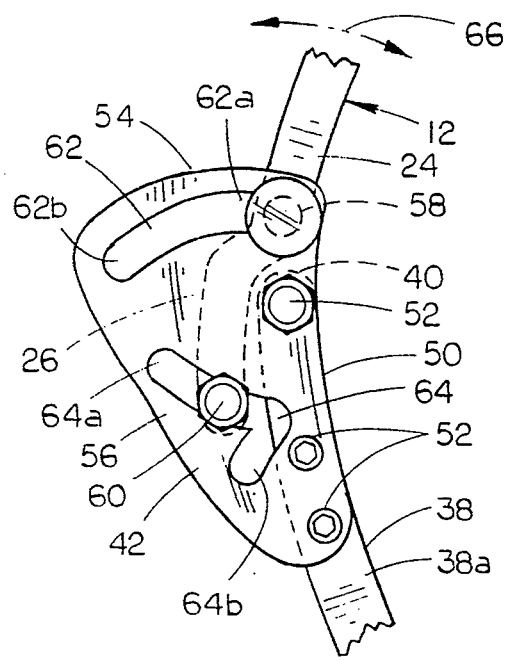
FIG. 3 is an enlarged elevational view of the hinge portion shown in FIG. 2.
Figure 4:
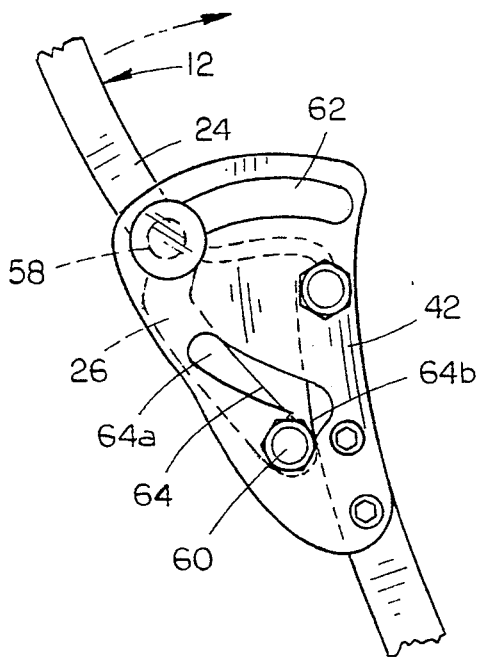
FIG. 4 is a view similar to FIG. 3 with the upper segment of the invention moved to a retracted position.

Lower end 24 of housing 16 includes a lip 26 which projects outwardly generally perpendicular to lower end 24 and thence downwardly generally parallel to lower end 24, as shown in FIGS. 1, 3 and 4. Lip 26 is formed to correspond with a portion of posterior segment 14 as described in more detail hereinbelow.

As shown in FIG. 1, posterior segment 14 includes an electronic NMR coil enclosed within a durable plastic housing 28 having forward and rearward edges 30 and 32 respectively, an upper end 34 and lower end 36. Housing 28 is curved from lower end 36 to upper end 34 so as to conform to the curvature of a conventional patient table. A flange 38 is mounted on upper end 34 of posterior segment 14 and extends arcuately and upwardly therefrom, following the general curvature of housing 28 so as to be generally vertical at the upper edge 40 thereof.

Figure 2:
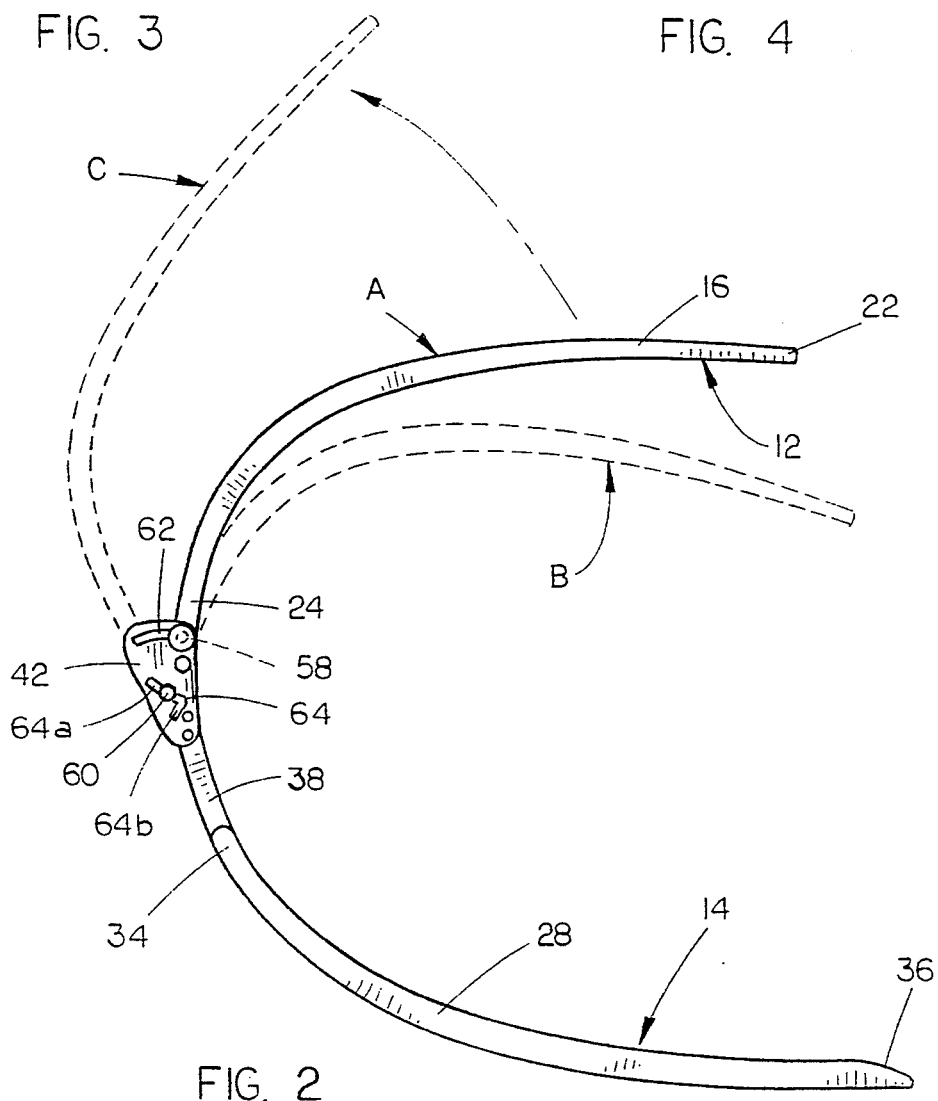
FIG. 2 is a side elevational view taken from the right side of FIG. 1.

Referring to FIG. 2, it can be seen that anterior segment 12 is pivotally connected to posterior segment 14 at a hinge plate 42 so as to be pivotable between an operable position shown in solid lines at A, to an inward position at broken lines and designated at B, and outwardly to an open position shown in broken lines at C. When in the standard operable position A, it can seen that the lower end 24 of anterior segment 12 is generally vertically aligned with flange 38 of posterior segment 14 to form a generally uniform curvature from the upper end 22 of anterior segment 12 to the lower end 36 of posterior segment 14. As shown in FIG. 3, lip 26 is offset from the curvature of lower end 24 so as to permit this alignment of the curvature of lower end 24 with flange 38.

Referring once again to FIG. 1, an electrical cable 44 extends out from housing 16 from the lower edge of lip 26, and enters housing 28 in the upper edge 40 of flange 38. The NMR coils in anterior and posterior segments 12 and 14 are electrically connected to the NMR equipment via a second cable 46 extending outwardly from posterior segment 14.

A pair of hinge plates 42 and 48 operably connect anterior and posterior segments 12 and 14. Since hinge plates 42 and 48 are identical, only hinge plate 42 will be described in detail herein. Referring now to FIG. 3, hinge plate 42 is generally triangular in shape with one edge 50 curved to a radius conforming to that of flange 38. Hinge plate 42 is affixed to the rearward edge 38a of flange 38 so as to be mounted in a plane transverse to flange 38. A plurality of screws 52, or similar fasteners, mounts hinge plate 42 in position with the curved inner edge 50 aligned with the curvature of flange 38. Hinge plate 42 also includes a generally horizontal upper edge 54 which extends outwardly from inner edge 50, and a rearward edge 56 forming the last side of the triangular shape.

As shown in FIG. 1, a pair of upper and lower pivot pins 58 and 60, respectively are affixed to the rearward edge 20 at the lower end 24 of housing 16, and the lower end of lip 26, respectively. Pivot pin 58 is threaded to receive an adjustment knob 58a, while pivot pin 60 is capped with nut 60a. Nut 60a permits free slidable movement of pivot pin 60, while knob 58a may be selectively tightened.

Referring once again to FIG. 3, triangular hinge plate 42 has an arcuate slot 62 formed along the upper edge 54 thereof. A generally L-shaped slot 64 is formed in the hinge plate 42, spaced from slot 62, and includes a long leg 64a and a short leg 64b. As shown in FIG. 3, long leg 64a is arcuate, and circumscribes an arch centered on pivot pin 58 when pivot pin 58 is located at the inner end 62a of slot 62. Thus, when pivot pin 58 is located at inner end 62a of slot 62, anterior segment 12 will pivot about pivot pin 58 as shown by arrow 66. As shown in FIG. 2 pivotal movement of anterior segment 12 from position A to position B is determined by the movement of pivot pin 60 within long leg 64a of slot 64.

Pivotal movement of anterior segment 12 between positions A and C in FIG. 2 is limited by the length of slot 62 as pin 58 slides therein. As shown in FIG. 4, slot 62 subscribes an arch centered about pivot pin 60, when pivot pin 60 is located at the lower end of short leg 64b in second slot 64. Movement of anterior segment 12 to position C, as shown in FIG. 2, permits convenient access to the interior of liver coil 10 by a patient.

As described hereinabove, the pivotal connection of anterior segment 12 with posterior segment 14 permits anterior segment 12 to be moved to open position C, shown in FIG. 2, so that a patient may be easily positioned with the lower abdomen located over the NMR coil within posterior segment 14. Anterior segment 12 is then moved to position A for most people, which positions the NMR coils within anterior segment 12 above the abdomen in a standard operating position. For smaller patients, adjustment knob 58a may be loosened to permit pivotal movement about pivot pin 58 such that anterior segment 12 is moved to position B, closer to the patient.

The use of manually operable knobs or knurled handles on pivot pin 58 permits quick and simple adjustability of anterior segment 12 between its operable positions and its open position.

Figure 5:
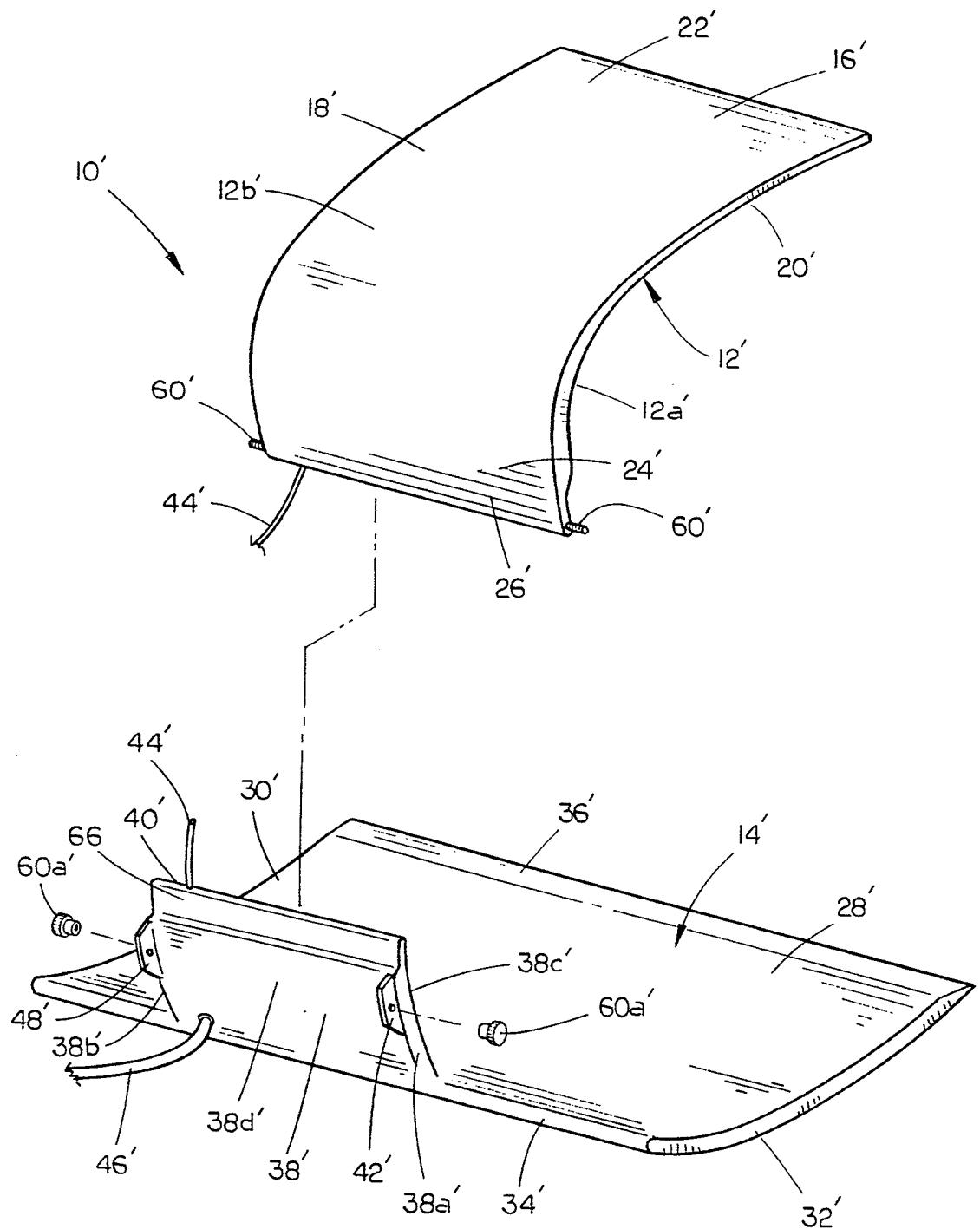
FIG. 5 is an exploded perspective view of a second embodiment of the invention.

Referring now to FIG. 5, a second embodiment of the NMR local liver coil is designated generally at 10' and includes an upper anterior segment 12' operably mechanically connected to an opposed lower posterior segment 14'.

Anterior segment 12' includes a plurality of electronic coils enclosed within a durable plastic housing 16'. As with the first embodiment, housing 16 includes opposing forward and rearward edges 18' and 20', an upper end 22' and a lower end 24'. Housing 16' is arcuate between upper end 22' and lower end 24', so as to extend from a generally horizontal position at upper end 22' to a generally vertical orientation at lower end 24', when anterior segment 12' is in the operable position shown in solid lines in FIG. 6.

Lower end 24' of housing 16' includes a lip portion 26' formed by a reduced thickness of housing 12'. As shown in FIG. 5, the thickness of housing 12' is preferably reduced solely from the bottom surface 12a' of anterior housing 12' such that top surface 12b' maintains a uniform curve. Lip 26' is formed to correspond with a portion of posterior segment 14', as described in more detail hereinbelow.

Posterior segment 14' includes an electronic NMR coil enclosed within a durable plastic housing 28' having forward and rearward edges 30' and 32' respectively, an upper end 34' and a lower end 36', similar to the first embodiment of the invention. The second embodiment of posterior segment 14' also includes a flange 38' mounted on upper end 34', similar to the first embodiment. Flange 38' includes a lip 66 formed at the upper end thereof by a reduction in the thickness of flange 38'. Preferably, lip 66 is formed by reducing the thickness of flange 38' along the outer surface 38a' while maintaining a uniform curved intersurface 38b'.

Figure 6:
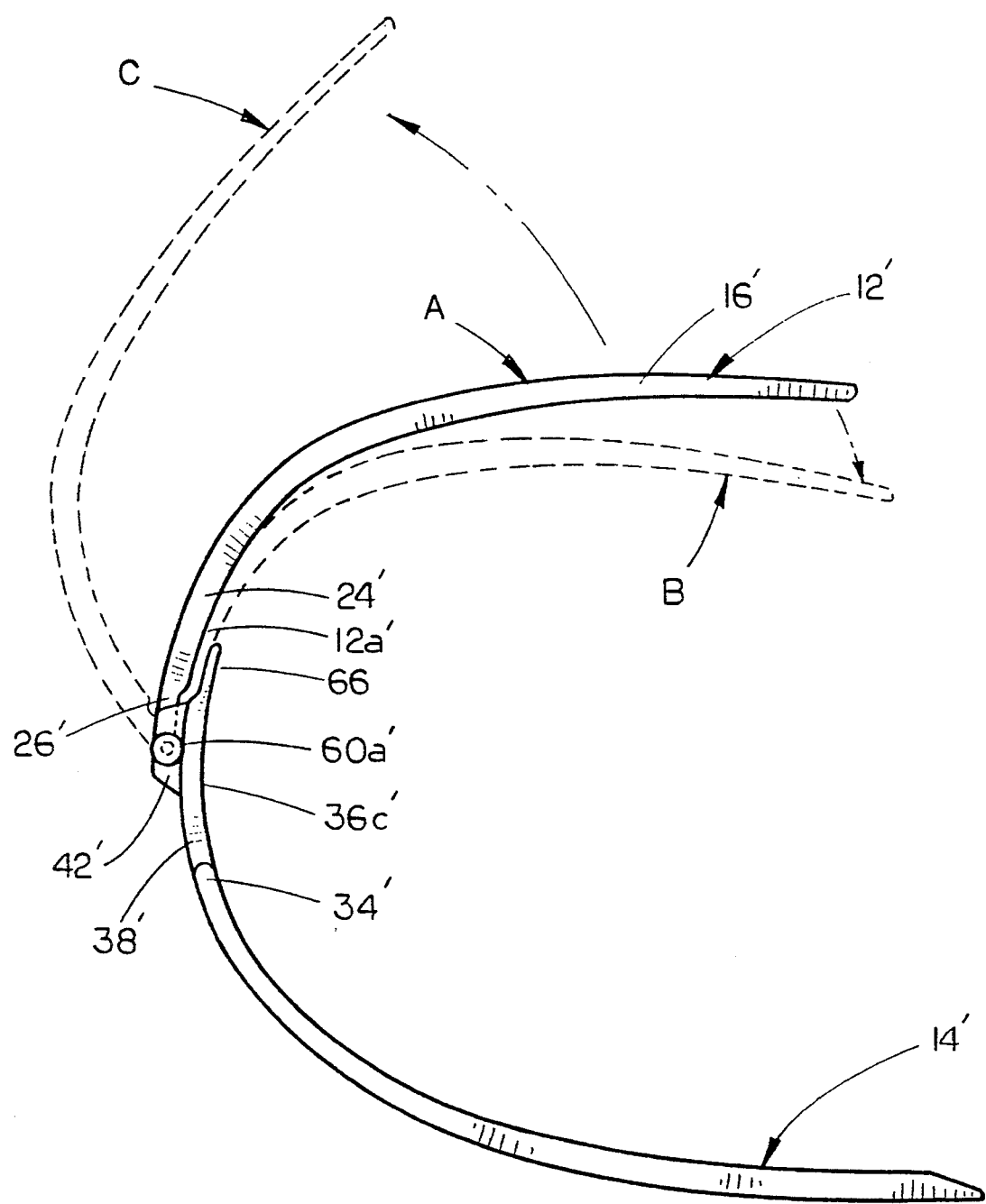
FIG. 6 is a side elevational view taken from the right side of FIG. 5.

Referring now to FIG. 6, it can be seen that anterior segment 12' is pivotally connected to posterior segment 14' at a hinge plate 42' so as to be pivotable between an operable position shown in solid lines at A, to an inward position shown by broken lines and designated generally at B, and outwardly to an open position shown in broken lines at C. When in the standard operable position A, it can be seen that the lower end of the inner surface 12a' is generally vertical and parallel with the inward surface 38' of flange 38. Lip 26' on anterior segment 12' and lip 66 on posterior segment 14' intermesh so as to assist in reducing the distance between the intersurface 38' of flange 38 and the inner surface 12a' of anterior segment 12.

Referring once again to FIG. 5, an electrical cable 44' extends out from housing 16' from the lower edge of lip 26', and enters housing 28' in the upper edge 40' of flange 38'. The NMR coils and anterior and posterior segments 12' and 14' are electrically connected to the NMR equipment via a second cable 46' extending outwardly from posterior segment 14'.

A pair of hinge plates 42' and 48' operably connect anterior and posterior segments 12' and 14'. Plates 42' and 48' are affixed to the rearward and forward edges 38a' and 38b' of flange 38' and projecting outwardly from the outward surface 38d' thereof. A pair of pivot pins 60' are affixed to the forward and rearward edges 18' and 20' at the lower end of lip 26'. Pivot pins 60' are threaded to receive hand operable knobs 60a', which may be selectively tightened to restrict pivotal movement of anterior segment 12' relative to posterior segment 14'.

The pivotal connection of anterior segment 12' with posterior segment 14' permits anterior segment 12' to be moved to open position C, shown in FIG. 6, so that a patient may be easily positioned with the lower abdomen located over the NMR coil within posterior segment 14'. Anterior segment 12' is then moved to position A for most people, which positions the NMR coils with an anterior segment 12' above the abdomen in a standard operating position. For smaller patients, adjustment knobs 60a' may be loosened to permit pivotal movement about pins 60' such that anterior segment 12' is moved to position B, closer to the patient.

Whereas the invention has been shown and described in connection with the preferred embodiment thereof, it will be understood that many modifications, substitutions and additions may be made which are within the intended broad scope of the appended claims. There has therefore been shown and described an improved NMR local coil which accomplishes at least all of the above stated objects.

I claim:

1. A liver coil, comprising:

an anterior housing supporting a plurality of NMR coils, having opposing forward and rearward edges, an upper end, and a lower end;
said anterior housing curved from a generally vertically oriented lower end to a generally horizontally oriented upper end, when the anterior housing is in a working position;
a posterior housing supporting a NMR coil, having opposing forward and rearward edges, an upper end and a lower end, operably and pivotally connected along its upper end to said anterior housing lower end;
said posterior housing curved upwardly from forward to rearward end to conform to the curvature of a conventional NMR patient table;
said posterior housing upper end including an arcuate flange curving rearwardly and upwardly with an upper edge oriented generally vertically, said flange having forward and rearward edges, said anterior housing operably pivotally connected to said flange;
means for operably, pivotally connecting the lower end of the anterior housing to the upper end of the posterior housing for selective pivotal movement from an open position, with the upper end of the anterior housing moved to a substantially vertical position, to an adjustable working position, with the upper end of the anterior housing oriented generally horizontally and adjustably spaced from the lower end of the posterior housing; and
a lip formed on the lower end of the anterior housing, said lip projecting rearwardly from the anterior housing lower end and thence downwardly generally parallel to the lower end of the anterior housing, such that the upper edge of the posterior housing flange is aligned with the lower end of the anterior housing when the anterior housing is in the adjustable working position, with said lip overlapping said flange.

2. The liver coil of claim 1, wherein said operable pivotal connection means includes:
first means for selectively pivotally connecting the lower edge of said lip to said flange, to permit pivotal movement of said anterior housing from the adjustable working position to the open position about a first pivot axis located along the lower edge of the lip; and
second means for selectively pivotally connecting the lower end of said anterior housing to said flange, to permit adjustable pivotal movement of said anterior housing in said working position about a second pivot axis located along the lower end of the anterior housing, parallel to the first pivot axis.

3. The liver coil of claim 2, wherein said operable pivotal connection means includes:
forward and rearward hinge plates mounted to the forward and rearward edges of said flange at the upper edge thereof and projecting rearwardly from said flange;
said first pivotal connection means including:
a first forward and a first rearward pivot pin projecting from forward and rearward edges of the lower edge of said lip, forming said first pivot axis;
said first forward and rearward pins slidably journaled through a first slot in the rearwardly projecting portion of said hinge plates;
said second pivotal connection means including:

a second forward and a second rearward pivot pin projecting from the forward and rearward edges of the lower end of said anterior housing, forming said second pivot axis;

said second forward and rearward pins slidably journaled through a second slot in the rearwardly projecting portion of said hinge plates;

said anterior housing being pivotal about the first pivot axis by sliding the second forward and rearward pins within the second slot; and said anterior housing being pivotal about the second pivot axis by sliding the first forward and rearward pins within the first slot.

4. The liver coil of claim 3, further comprising means for selectively locking the anterior housing so as to selectively prevent pivotal movement about the first and second pivot axes.

5. A liver coil, comprising:

an anterior housing supporting a plurality of NMR coils, having opposing forward and rearward edges, an upper end, and a lower end;

said anterior housing curved from a generally vertically oriented lower end to a generally horizontally oriented upper end, when the anterior housing is in a working position;

a posterior housing supporting a NMR coil, having opposing forward and rearward edges, an upper end and a lower end, operably and pivotally connected along its upper end to said anterior housing lower end;

said posterior housing curved upwardly from forward to rearward end to conform to a curvature of a conventional NMR patient table;

said posterior housing upper end including an arcuate flange curving rearwardly and upwardly with an upper edge oriented generally vertically, said flange having forward and rearward edges, said anterior housing operably pivotally connected to said flange;

means for operably, pivotally connecting the lower end of the anterior housing to the upper end of the posterior housing for selective pivotal movement from an open position, with the upper end of the anterior housing moved to a substantially vertical position, to an adjustable working position, with the upper end of the anterior housing oriented generally horizontally and adjustably spaced from the lower end of the posterior housing; and a lip formed on the lower end of the anterior housing, said lip formed by reducing the thickness of the housing from an inward surface thereof, such that an outer surface of said housing maintains a uniform curvature;

said lip overlapping the upper edge of the posterior housing flange such that the inward surface of the anterior housing at the lower end thereof is substantially parallel and substantially aligned with an inward surface at the upper end of the posterior housing flange when the anterior housing is in the adjustable working position.

6. The liver coil of claim 5, wherein said operable pivotal connection means includes first means for selectively pivotally connecting a lower edge of said lip to said flange, to permit pivotal movement to the anterior housing from the adjustable working position to the open position about a pivotal axis located adjacent the lower edge of the lip.

7. The liver coil of claim 6, wherein said operable pivotal connection means includes forward and rearward hinge plates mounted to the forward and rearward edges of said flange and projecting rearwardly from said flange, said anterior housing including a forward and rearward pivot pin projecting from forward and rearward edges of the lower edge of said lip, forming said pivotal axis, said pins rotatably journaled through an aperture in the rearwardly projecting portion of said hinge plates.

8. The liver coil of claim 7, further comprising means for selectively locking the anterior housing so as to selectively prevent pivotal movement about said pivotal axis.

* * * * *